United States Patent [19]

Yagi

[11] 3,882,409

[45] May 6, 1975

[54] DIFFERENTIAL AMPLIFIER CIRCUIT

[75] Inventor: Atsuo Yagi, Ebina, Japan

[73] Assignee: Sony Corporation, Tokyo, Japan

[22] Filed: Apr. 22, 1974

[21] Appl. No.: 463,162

[30] Foreign Application Priority Data

May 1, 1973 Japan ................................ 48-52287

[52] U.S. Cl. .................... 330/6; 330/30 D; 330/35; 330/69

[51] Int. Cl. ............................................. H03f 15/00

[58] Field of Search .................. 330/30 D, 69, 35, 6

[56] References Cited

UNITED STATES PATENTS

| | | | |
|---|---|---|---|
| 3,305,790 | 2/1967 | Parsons et al. | 330/6 |
| 3,613,021 | 10/1971 | Scheidt | 330/6 |
| 3,810,031 | 5/1974 | Poujois | 330/6 |

*Primary Examiner*—Nathan Kaufman
*Attorney, Agent, or Firm*—Lewis H. Eslinger; Alvin Sinderbrand

[57] ABSTRACT

In a differential amplifier circuit having first and second field effect transistors connected in parallel to operate differentially according to differential input signal voltages applied to the respective gate electrodes thereof; a third field effect transistor is connected in series with the parallel circuit of the first and second field effect transistors to operate as a current source or sink, a feedback loop is provided from the drain electrode of the first field effect transistor to the gate electrode of the third field effect transistor, and an output signal is derived from the drain electrode of the second field effect transistor, so that the feedback loop operates as a negative feedback circuit in respect to temperature for stabilizing the circuit and the feedback loop further operates as a positive feedback circuit for signals to increase the gain of the circuit. The circuit configuration is particularly well suited to be formed, together with other circuits, as an integrated circuit on a single semiconductor wafer.

16 Claims, 6 Drawing Figures

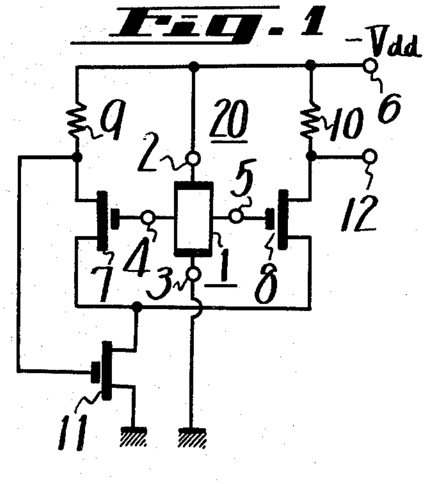
FIG. 3
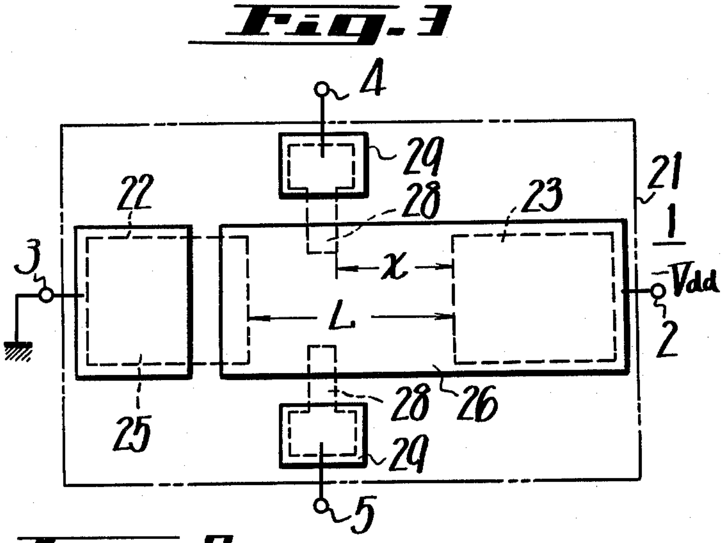
FIG. 2
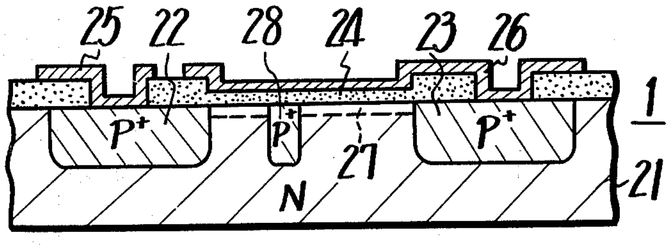
FIG. 4
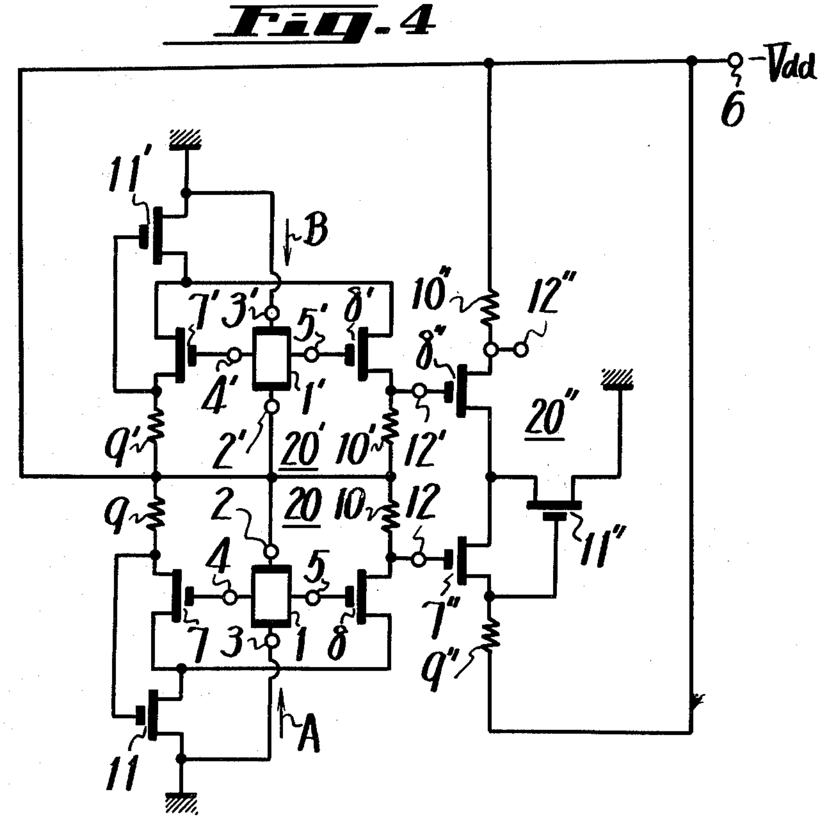

DIFFERENTIAL AMPLIFIER CIRCUIT

BACKGROUND OF THE INVENTION

1. Field of the Invention

This invention relates generally to a differential amplifier circuit, and more particularly to improvements in such a circuit which employs field effect transistors (FETs), such as, metal oxide semiconductor-field effect transistors (MOS-FETs), as its active elements.

2. Description of the Prior Art

Various kinds of differential amplifier circuits utilizing FETs, such as MOS-FETs, are known in the prior art and such differential amplifier circuits are used in many different types of electronic devices.

In such known differential amplifier circuits, a temperature compensation circuit is often provided, because the characteristics of the MOS-FETs are substantially changed in response to temperature variations.

However, the temperature compensation circuits provided in the known differential amplifier circuits are usually complicated in construction, and also do not provide accurate or adequate temperature compensation over a substantial range of temperatures.

SUMMARY OF THE INVENTION

Accordingly, it is an object of this invention to provide an improved differential amplifier circuit which utilizes field effect transistors as its active elements.

Another object of this invention is to provide a differential amplifier circuit which includes an improved temperature compensation circuit.

Another object of this invention is to provide a differential amplifier circuit which operates stably with a high gain over a wide range of temperatures.

A further object is to provide a differential amplifier circuit which is suitable for amplifying a signal of low level, for example, as from a Hall-effect device.

A still further object of this invention is to provide a differential amplifier circuit suitable for being formed, together with other circuit elements, for example, a Hall-effect device, as an integrated circuit on a single semiconductor wafer.

A differential amplifier circuit according to an aspect of this invention includes first and second field effect transistors which are connected in parallel and operate differentially in accordance with an input signal supplied between the gate electrodes thereof, for example, from a Hall-effect device, and the circuit further includes a third field effect transistor which is connected in series with the parallel circuit of the first and second field effect transistors and operates as a current source or sink. A feedback loop is provided between the drain electrode of the first field effect transistor and the gate electrode of the third field effect transistor and an output signal is derived from the drain electrode of the second field effect transistor. The foregoing differential amplifier circuit configuration is of a so-called "unbalanced output" type, and the feedback loop operates as a negative feedback circuit to compensate for changes in the characteristics of the field effect transistors resulting from temperature variations, and the feedback loop further operates as a positive feedback circuit in respect to the amplifying of the input signal so as to increase the gain of the amplifier.

In order to provide a highly amplified output signal, first, second and third differential amplifier circuits, each of which is constituted as described above, are combined, with a pair of differential input signals being supplied to the first and second differential amplifier circuits, respectively, and a pair of differential output signals from the first and second differential amplifier circuits being supplied to the third differential amplifier circuit to be further amplified by the latter, so that the desired highly amplified output signal is obtained from the third differential amplifier circuit.

The above, and other objects, features and advantages of the invention, will be apparent in the following detailed description of illustrative embodiments of the invention which is to be read in connection with the accompanying drawings.

BRIEF DESCRIPTION OF THE DRAWINGS

FIG. 1 is a circuit diagram of a differential amplifier circuit according to an embodiment of the present invention;

FIG. 2 is a sectional view of a Hall-effect device used as a signal input device in the circuit of FIG. 1;

FIG. 3 is a top plan view of the Hall-effect device shown in FIG. 2;

FIGS. 4 and 5 are circuit diagrams respectively showing other embodiments of the invention employing a plurality of differential amplifiers of the type shown in FIG. 1.

DESCRIPTION OF THE PREFERRED EMBODIMENTS

Figure 5:
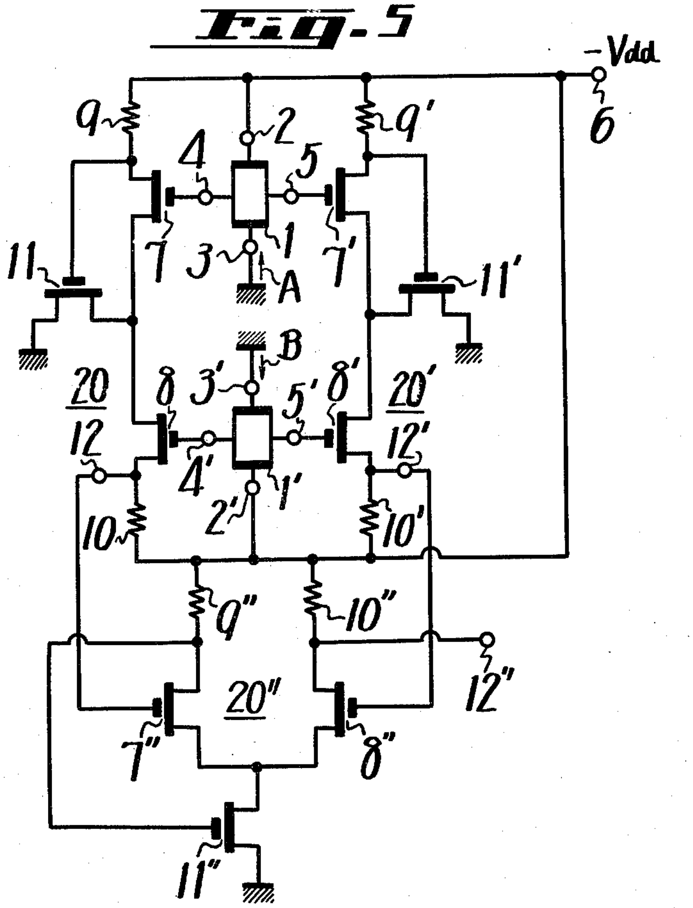

Referring to FIG. 1 in detail, it will be seen that, in a differential amplifier circuit 20 according to the present invention as there shown, a Hall-effect device 1 is used as an input signal source. Input voltage terminals 2 and 3 of Hall-effect device 1 are connected to a voltage source terminal 6 applying a voltage $-V_{dd}$ and to a reference voltage terminal, such as ground, respectively. Output terminals 4 and 5 of Hall-effect device 1 are connected to gate electrodes of field effect transistors (FETs), such as metal oxide semiconductor-field effect transistors (MOS-FETs) 7 and 8, respectively. The drain electrodes of MOS-FETs 7 and 8 are connected to voltage source terminal 6 through resistors 9 and 10, respectively. The source electrodes of MOS-FETs 7 and 8 are connected together to the ground through the drain-source of a MOS-FET 11, and the gate electrode of the latter is connected to the drain electrode of MOS-FET 7 to provide a feedback loop. An output terminal 12 is led out from the drain electrode of MOS-FET 8 to complete the differential amplifier circuit 20. The resistors 9 and 10 are usually formed as MOS-FETs.

In the embodiment of FIG. 1, the Hall-effect device 1 is preferably formed as a MOS-structure, for example, as shown in FIGS. 2 and 3. In producing such Hall-effect device, a silicon semiconductor substrate 21 of N-type conductivity is first prepared. Then, first and second regions 22 and 23 of P+-type conductivity are formed at spaced apart areas on one surface of substrate 21 and an insulation layer 24 is formed on the surface between the first and second regions 22 and 23. An electrode 25 is formed on the first region 22 and an electrode 26 is formed on the second region 23 and extends from the latter over the insulation layer 24 between regions 23 and 22. Input voltage terminals 2 and 3 are led out from electrodes 25 and 26, respectively. Regions 28 of P+-type conductivity (high impurity concentration or highly doped) are formed on the substrate 21 at the opposite sides of a channel 27 extending between regions 22 and 23, and the regions 28 extend in the direction at right angles to channel 27 and project into or are connected to the channel 27. Electrodes 29 are formed on regions 28, respectively, and voltage output terminals 4 and 5 of the Hall-effect device 1 are led out from the electrodes 29, respectively.

The FETs 7, 8 and 11 and the resistors 9 and 10, which may also be formed as MOS-FETs, are formed on the same substrate 21 as the Hall-effect device 1 to provide an integrated circuit therewith.

In general, the threshold voltage of a MOS-FET is about 1 to 2 volts and a MOS-FET requires the application thereto of a suitable bias voltage to carry out amplification. In other words, in order to operate a MOS-FET, the sum voltage $V_{th}+V_S+\Delta V_{th}$ (where $V_{th}$ represents the threshold voltage of the MOS-FET, $V_S$ the source bias voltage and $\Delta V_{th}$ the change of the threshold voltage $V_{th}$ caused by the application of the source bias voltage $V_S$) must be applied to the MOS-FET at its gate electrode.

At the output terminals 4 and 5 of the Hall-effect device 1, there appears the Hall-effect voltage which is expressed as follows:

$$(V_{dd} - V_{th})\{1 - (1 - x/L)^{1/2}\}$$

where $V_{dd}$ represents the power supply voltage, $x$ the length of the portion of channel 27 between regions 23 and 28, and $L$ the length of the channel 27.

Accordingly, if $x/L$ is suitably selected, the Hall-effect voltage of Hall-effect device 1, when applied to the gate electrodes of FETs 7 and 8 as the bias voltage may be adequate to make the FETs 7 and 8 conductive. By way of example, if it is assumed that $V_{dd} = -20V$ (volts), $V_{th}=-2V$ and $x/L=0.383$, the resulting Hall-effect voltage is $-3.86V$ and is applied to the gate electrodes of the FETs 7 and 8, respectively.

Accordingly, with the construction described above, differential output signals are obtained from the output terminals 4 and 5 of Hall-effect device 1 in response to the detection of a magnetic field by Hall-effect device 1. The output signals from the Hall-effect device 1 are differentially amplified by FETs 7 and 8 and then delivered to the output terminal 12 as a detected output signal. In this case, when the drain voltage of FET 8 is increased, the drain voltage of the other FET 7 is lowered and the gate voltage of FET 11 is lowered. As a result, the drain current of the FET 11 increases and hence the drain current of the FET 8 increases to similarly increase its drain voltage. Thus, a positive feedback is applied to this circuit and, consequently, the gain of the differential amplifier circuit is high as compared with the gain in the case where no positive feedback is applied (this is, if the gate electrode of FET 11 is not connected to the drain electrode of FET 7). Thus, the sensitivity to the magnetic field is increased. If the resistors 9 and 10 are equal in resistance value, by way of example, the sensitivity becomes about 6dB or about twice the sensitivity without the positive feedback.

When the circuit is effected by changes in the ambient temperature, or the currents through the drain electrodes of FETs 7 and 8 are otherwise made to vary in common, that is, in the same direction, the drain voltages of FETs 7 and 8 tend to be changed in the same direction. However, the connection from the drain electrode of FET 7 to the gate electrode of the FET 11 serves as a negative feedback circuit, so that the drain voltages of FETs 7 and 8 remain unchanged. More specifically, when the drain voltages of the FETs 7 and 8 both tend to increase, the gate voltage of FET 11 is similarly increased to decrease its drain current. Such decrease in the drain current of FET 11 decreases the drain currents of FETs 7 and 8 to lower their drain voltages.

By way of example, in the absence of the described feedback loop, that is, when no connection exists from the drain electrode of FET 7 to the gate electrode of FET 11, the change in the drain voltage of FETs 7 and 8 caused by changes in the ambient temperature is 0.9% per degree C. However, by connecting the drain electrode of FET 7 to the gate electrode of FET 11, as shown in FIG. 1, the changing rate of the drain voltage of FETs 7 and 8 is reduced to 0.02% per degree C.

Further, the Hall-effect device 1, when formed as a MOS-structure, is itself inexpensive and stable in respect to temperature changes, so that the circuit shown in FIG. 1 can be formed at low cost and is stable in respect to temperature changes. Although the Hall-effect device 1 formed as a MOS-structure is itself inherently low in detecting sensitivity, the overall circuit is relatively high in sensitivity due to the fact that the differential amplifier circuit formed of the FETs 7, 8 and 11 is integrated with the Hall-effect device and, hence, the output signal from the circuit can be easily treated.

Referring now to FIG. 4, it will be seen that, in a circuit according to another embodiment of the invention, the sensitivity of the response to the magnetic field to be detected is greatly increased, as compared with that of the differential amplifier circuit 20 shown on FIG. 1, by combining with the circuit 20 a plurality of similar circuits or units 20' and 20''.

More specifically, in the embodiment of FIG. 4, the second differential amplifier circuit 20', which is substantially the same as the previously described circuit 20, is paired with the differential amplifier circuit 20 to provide differential output signals which constitute the differential input signals to the third differential amplifier circuit 20''. Further, in this embodiment, the circuit components which make up the differential amplifier circuits 20, 20' and 20'' are preferably all formed as an integrated circuit, as in the case of the circuit of FIG. 1. On FIG. 4, the components of the first differential amplifier circuit 20 are identified by the same reference numerals as on FIG. 1, and the corresponding components of the second and third differential amplifier circuit 20' and 20'' are identified by the same reference numerals, but with a single prime (') and a double prime ('') respectively appended thereto.

In the circuit shown on FIG. 4, a Hall-effect device 1' is provided in the second differential amplifier circuit 20' as a second input signal source, and the third differential amplifier circuit 20'' does not include a Hall-effect device. Further, the Hall-effect devices 1 and 1' of circuits 20 and 20' are arranged to provide output signals of opposite polarity at the respective output terminals 12 and 12'. Output terminals 12 and 12' of the paired differential amplifier circuits 20 and 20' are respectively connected to the gate electrodes of FETs 7'' and 8'' of the third differential amplifier circuit 20'', and an output terminal 12'' is led out from the drain electrode of the FET 8''. As before, resistors 9′, 10′, 9″ and 10″ can be also constituted by MOS-FETs.

The circuit shown on FIG. 4 operates as follows: Since DC currents flow to Hall-effect devices 1 and 1′ in the directions indicated by arrows A and B, that is, in opposite directions, the Hall-effect voltage obtained across terminals 4 and 5 of Hall-effect device 1 in response to a magnetic field having its magnetic lines of flux directed perpendicular to the plane of the drawing and passed through both Hall-effect devices 1 and 1′ in the same direction, is opposite in polarity to the Hall-effect voltage obtained across the terminals 4′ and 5′ of Hall-effect device 1′. The Hall-effect voltage appearing across terminals 4 and 5 is amplified by the FETs 7 and 8, and the Hall-effect voltage appearing across terminals 4′ and 5′ is amplified by FETs 7′ and 8′. Thus, the signals delivered from the drain electrodes of FETs 8 and 8′ to output terminals 12 and 12′ are opposite in polarity to each other. Such signals obtained at terminals 12 and 12′ are differentially applied to FETs 7″ and 8″ of third differential amplifier circuit 20″ and amplified thereby to provide a relatively high level output signal at output terminal 12″.

Accordingly, the sensitivity of the circuit shown on FIG. 4 to the magnetic field is several hundred times greater than that of the circuit shown on FIG. 1. By way of example, if the sensitivity of the circuit shown on FIG. 1 is 300 milli volt/kilo gauss, that of the circuit shown on FIG. 4 is about 1 to 2 volt/kilo gauss.

With the circuit of FIG. 4, the DC bias for the gate electrodes of FETs 7″ and 8″ of the third differential amplifier circuit 20″ is applied from the drain electrodes of the FETs 8 and 8′ directly, so that there is no need to provide a bias circuit especially therefor, with the result that the circuit construction is simplified. Further, since the circuit is formed symmetrically, changes in the outputs from terminals 12 and 12′ due to temperature changes or fluctuation of the power supply voltage $-V_{dd}$ in the first and second differential amplifier circuits 20 and 20′ are common mode input signals to the third differential amplifier circuit 20″ so that they are cancelled therein with the result that the output signal delivered to the output terminal 12″ is not influenced by the above mentioned fluctuation and hence is very stable.

FIG. 5 shows a circuit according to another embodiment of the invention which is generally similar to that of FIG. 4, and which differs from the latter only in the following respects. In the circuit of FIG. 4, Hall-effect device 1 is employed as the input signal source for the first differential amplifier circuit 20 and Hall-effect device 1′ is employed as the input signal source for the second differential amplifier circuit 20′, that is, output terminals 4 and 5 of device 1 are connected to the gate electrodes of FETs 7 and 8 and output terminals 4′ and 5′ of device 1′ are connected to the gate electrodes of FETs 7′ and 8′. On the other hand, in the circuit of FIG. 5 in which the Hall-effect devices 1 and 1′ again have Hall-effect voltages of opposite polarity, the terminals 4 and 4′ are connected to the gate electrodes of FETs 7 and 8 and the terminals 5 and 5′ are connected to the gate electrodes of FETs 7′ and 8′. Apart from the foregoing, the circuit of FIG. 5 is the same as that described above with respect to FIG. 4 and has the same operation and characteristics.

Figure 6:
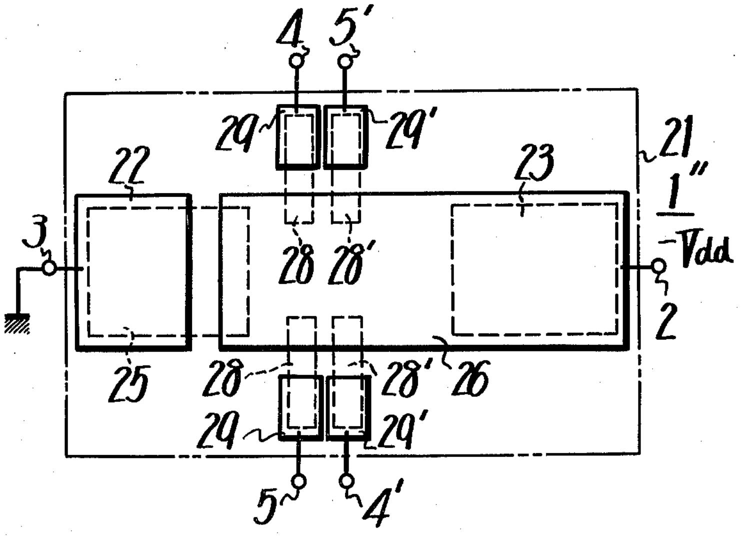
FIG. 6 is a top plan view of a pair of Hall-effect devices for use in the circuits of FIGS. 4 and 5, respectively.

In FIGS. 4 and 5, the Hall-effect devices 1 and 1′ are shown to be independent of each other and may be each formed as shown on FIGS. 2 and 3. However, as shown on FIG. 6, the equivalent of the pair of Hall-effect devices 1 and 1′ can be provided integrally in a Hall-effect device 1″ which is similar to the Halleffect device 1 of FIGS. 2 and 3 and has its corresponding elements identified by the same reference numerals. As shown, the Hall-effect device 1″, which may be employed in place of the devices 1 and 1′ in the circuit of FIG. 4 or the circuit of FIG. 5, includes a pair of regions 28′ of P+-type conductivity disposed in the substrate 21 close to the previously mentioned regions 28, and electrodes 29′ formed on the regions 28′. Further, output terminals 4′ and 5′ extend from the electrodes 29′. In order that the Hall-effect voltage between output terminals 4 and 5 will be of opposite polarity to the Hall-effect voltage between output terminals 4′ and 5′ of device 1″, the output terminals 4′ and 5′ are associated with electrodes 29′ on the regions 28′ which are at the opposite sides of the channel 27 from the regions 28 carrying the electrodes 29 with which the terminals 4 and 5 are respectively associated, that is, terminals 4 and 5′ are at one side of the device and terminals 5 and 4′ are at the opposite side of the device. Further, the regions 28 and 28′ at each side of the device 1″ are formed as close to each other as possible so that, when no magnetic field exists to be detected, the voltages at terminals 4 and 5′ will be substantially equal and the voltages at terminals 4′ and 5 will also be substantially equal, and further so that, in the presence of a magnetic field, the Hall-effect voltage between terminals 4 and 5 will be substantially equal, but of the opposite polarity to the Hall-effect voltage between terminals 4′ and 5′.

In the circuits of FIGS. 1, 4 and 5, one or more Halleffect devices have been employed as the input signal source for the differential amplifier circuit or circuits, that is, in each case the differential input signals are produced in response to the detection of a magnetic field, as by one or more magnetoelectric transducers. However, it is apparent that the described circuits embodying the invention can be associated with other types of input signal sources, for example, acoustic-electro transducers or the like which produce differential input signals in response to sounds or acoustic energy.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A differential amplifier circuit comprising:

a power supply source having first and second voltage terminals;

signal input means for providing differential input signal voltages; and at least a first differential amplifier unit including first, second and third field effect transistors each having gate, source and drain electrodes, means connecting the drain-source paths of said first and second field effect transistors in parallel with each other and in series with the drain-source path of said third field effect transistor between said first and second voltage terminals, means for applying said differential input signal voltages to the gate electrodes of said first and second field effect transistors, a signal output terminal connected to said drain electrode of said second field effect transistor for providing an amplified output signal, and a feedback loop connected between said drain electrode of said first field effect transistor and said gate electrode of said third field effect transistor for providing negative feedback in respect to common changes in the currents through the drain electrodes of said first and second field effect transistors and positive feedback in respect to the amplification of said differential input signal voltages.

2. A differential amplifier circuit according to claim 1; wherein said signal input means includes a Hall-effect device having a pair of input terminals connected between said first and second voltage terminals and a pair of output terminals respectively connected to the gate electrodes of said first and second field effect transistors.

3. A differential amplifier circuit according to claim 2; wherein at least said first, second and third field effect transistors and said Hall-effect device form an integrated circuit on a single semiconductor wafer.

4. A differential amplifier circuit according to claim 1; further comprising second and third differential amplifier units each of which is similar to said first differential amplifier unit; and in which said signal input means includes first and second signal sources respectively providing differential input signal voltages of opposed polarities, the differential input signal voltages from said first signal source are applied to the gate electrodes of said first and second field effect transistors in said first differential amplifier unit and the differential input signal voltages from said second signal source are applied to the gate electrodes of said first and second field effect transistors in said second differential amplifier unit so that the amplified output signals from said first and second differential amplifier units are of opposite polarity, and the signal output terminals of said first and second differential amplifier units are respectively connected to the gate electrodes of said first and second field effect transistors of said third differential amplifier unit so that said amplified output signals from said first and second differential amplifier units provide the differential input signal voltages for said third differential amplifier unit.

5. A differential amplifier circuit according to claim 4; in which each of said first and second signal sources includes a Hall-effect device having a pair of input terminals connected between said first and second voltage terminals and a pair of output terminals respectively connected to the gate electrodes of said first and second field effect transducers of the corresponding one of said first and second differential amplifier units.

6. A differential amplifier circuit according to claim 5; in which at least said first, second and third field effect transistors of said first, second and third differential amplifier units and the Hall-effect devices of said first and second input signal sources form an integrated circuit on a single semiconductor wafer.

7. A differential amplifier circuit comprising:

a power supply source having first and second voltage terminals;

first, second and third field effect transistors each having gate, source and drain electrodes;

signal input means providing differential input signal voltages applied to the gate electrodes of said first and second field effect transistors;

first and second resistors connected between the drain electrodes of said first and second field effect transistors, respectively, and said first voltage terminal;

circuit means for commonly connecting the source electrodes of said first and second field effect transistors to the drain electrode of said third field effect transistor;

circuit means for connecting the source electrode of said third field effect transistor to said second voltage terminal;

a feedback loop connecting the drain electrode of said first field effect transistor to the gate electrode of said third field effect transistor; and signal output means connected to the drain electrode of said second field effect transistor; whereby said feedback loop provides negative feedback for a common change of currents through the drain electrodes of said first and second field effect transistors and provides positive feedback for the amplification of the differential input signal voltages from said signal input means.

8. A differential amplifier circuit according to claim 7; wherein said signal input means includes a Hall-effect device having a pair of input terminals connected between said first and second voltage terminals and a pair of output terminals respectively connected to the gate electrodes of said first and second field effect transistors.

9. A differential amplifier circuit according to claim 8; wherein at least said first, second and third field effect transistors and said Hall-effect device form an integrated circuit on a single semiconductor wafer.

10. A differential amplifier circuit comprising:

a power supply source having first and second voltage terminals;

first, second and third differential amplifier units each of which comprises first, second and third field effect transistors each having gate, source and drain electrodes, circuit means connected between the drain electrode of said first field effect transistor and said first voltage terminal, a resistor connected between the drain electrode of said second field effect transistor and said first voltage terminal, circuit means for connecting the source electrodes of said first and second field effect transistors to the drain electrode of said third field effect transistor, circuit means for connecting the source electrode of said third field effect transistor to said second voltage terminal, means for biasing the gate electrode of said third field effect transistor, and signal output means connected to the drain electrode of said second field effect transistor;

first signal input means providing differential input signal voltages to the gate electrodes of said first and second field effect transistors of said first differential amplifier unit;

second signal input means providing differential input signal voltages which are differential in respect to the input signal voltages from said first signal input means and which are applied to the gate electrodes of said first and second field effect transistors, respectively, of said second differential amplifier unit so that the output signals from the signal output means of said first and second differential amplifier circuits are differential to each other; and circuit means connecting the signal output means of said first and second differential amplifier circuits to the gate electrodes of the first and second field effect transistors, respectively, of said third differential amplifier circuit.

11. A differential amplifier circuit according to claim 10; in which said circuit means connected between the drain electrode of said first field effect transistor and said first voltage terminal includes a resistor, and the drain electrode of said first field effect transistor is connected to the gate electrode of said third field effect transistor in each of said differential amplifier units.

12. A differential amplifier circuit according to claim 11; in which said first signal input means includes a first Hall-effect device having a pair of terminals connected between said first and second voltage terminals and a pair of output terminals connected between the gate electrodes of said first and second field effect transistors of said first differential amplifier unit, and said second signal input means includes a second Halleffect device having a pair of terminals connected between said first and second voltage terminals and a pair of output terminals connected between the gate electrodes of said first and second field effect transistors of said second differential amplifier unit.

13. A differential amplifier circuit according to claim 12; in which at least said first, second and third differential amplifier units and said first and second Hall-effect devices form an integrated circuit on a single semiconductor wafer.

14. A differential amplifier circuit according to claim 11; in which said first and second signal input means respectively include first and second Hall-effect devices each having a pair of terminals connected between said first and second voltage terminals and a pair of output terminals, one of the output terminals of each of said first and second Hall-effect devices being connected to the gate electrodes of said first and second field effect transistors of said first differential amplifier circuit, respectively, and the other output terminals of each of said first and second Hall-effect devices being connected to the gate electrodes of said first and second field effect transistors of said second differential amplifier circuit.

15. A differential amplifier circuit according to claim 14; in which at least said first, second and third differential amplifier circuits and said first and second Hall-effect devices form an integrated circuit on a single semiconductor wafer.

16. A differential amplifier circuit according to claim 11; in which said first and second signal input means are constituted by a single Hall-effect device having a pair of input terminals connected between said first and second voltage terminals and first and second pairs of output terminals for respectively providing said differential input signal voltages from said first and second signal input means.

* * * * *